United States Patent
Hsu et al.

(10) Patent No.: US 6,941,414 B2
(45) Date of Patent: Sep. 6, 2005

(54) HIGH SPEED EMBEDDED DRAM WITH SRAM-LIKE INTERFACE

(75) Inventors: Louis L. Hsu, Fishkill, NY (US); William Wu Shen, Los Altos, CA (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 09/855,240

(22) Filed: May 15, 2001

(65) Prior Publication Data

US 2002/0174291 A1 Nov. 21, 2002

(51) Int. Cl.[7] .............................................. G06F 12/00
(52) U.S. Cl. ...................... 711/105; 711/118; 711/154
(58) Field of Search ................................ 711/105, 118, 711/154; 365/230.02, 189.01, 189.02, 189.05

(56) References Cited

U.S. PATENT DOCUMENTS

| | | | | |
|---|---|---|---|---|
| 6,157,973 A | * | 12/2000 | Ohtani et al. | 710/100 |
| 6,295,593 B1 | * | 9/2001 | Hsu et al. | 711/169 |
| 6,347,063 B1 | * | 2/2002 | Dosaka | 365/233 |
| 6,415,353 B1 | * | 7/2002 | Leung | 711/106 |

OTHER PUBLICATIONS

Yasuharu Sato, et al., "Fast Cycle RAM (FCRAM); a 20–ns Random Row Access, Pipe–Lined Operating DRAM", *IEEE Symposium on VLSI Circuits Digest of Technical Papers*, pp. 22–25, Jun. 1998.

Yasuhiro Agata, et al., An 8ns Random Cycle Embedded RAM Macro with Dual–Port Interleaved DRAM Architecture (D2RAM), *IEEE International Solid–State Circuits Conference*, pp. 392–393, Feb. 9, 2000.

* cited by examiner

*Primary Examiner*—Kimberly McLean-Mayo
(74) *Attorney, Agent, or Firm*—Scully, Scott, Murphy & Presser; Robert M. Trepp, Esq.

(57) ABSTRACT

The invention provides a simple interface circuit between a large capacity, high speed DRAM and a single port SRAM cache to achieve fast-cycle memory performance. The interface circuit provides wider bandwidth internal communications than external data transfers. The interface circuit schedules parallel pipeline operations so that one set of data buses can be shared in cycles by several data flows to save chip area and alleviate data congestion. A flexible design is provided that can be used for a range of bandwidths of data transfer and generally any size bandwidth ranging from 32 to 4096 bits wide can use this same approach.

19 Claims, 8 Drawing Sheets eDRAM Cache Interface Circuits eDRAM Cache Interface Circuits

Figure 1

Two-Cycle Read Hit Data Path

Figure 2

Two-Cycle Write Hit Data Path

Figure 3

Three-Cycle Read Miss Data Path

Figure 4

Three-Cycle Write Miss Data Path

Figure 5

Pipe Operation Code

Figure 6

Read/Write Pipeline Sequences

Figure 7

Parallel RH and WH Operations

Figure 8-1

Parallel WH and RM Operations

Figure 8-2

Parallel RH and WM Operations

Figure 8-3

Parallel RM and WM Operations

Figure 8-4

Possible Operation Sequence and Delay

Figure 9

HIGH SPEED EMBEDDED DRAM WITH SRAM-LIKE INTERFACE

BACKGROUND OF THE INVENTION

1. Field of the Invention

The present invention relates generally to a high speed embedded DRAM with a SRAM-like interface, and more particularly pertains to a high speed embedded DRAM with a single port SRAM-like interface which is used in short-cycle high-speed data operations.

2. Discussion of the Prior Art

To further improve the speed of DRAM memory, several embedded DRAMs with a SRAM-like interface have been proposed recently. A 1T(Transistor)-SRAM is described in several issued U.S. patents, and is a popular approach. In the disclosed 1T-SRAM, a dual port SRAM is used as a cache between a DRAM and the outside world. In general, the size of the dual port SRAM is about 2.5× larger than that of a single port SRAM, and is about 15× larger than the same capacity DRAM. In some embedded applications, not only the speed, but also the size of the memory is critical. This is especially true for some applications, for example, a router switch, network processor, etc. where a large memory size is required. In the disclosed 1T-SRAM, the efficiency of pipeline data flow is low, and the prior art does not discuss sharing of internal buses to save chip area. Data congestion also appears to be a substantial problem with the design.

SUMMARY OF THE INVENTION

Accordingly, it is a primary object of the present invention to provide a high speed embedded DRAM with a SRAM-like interface.

A further object of the subject invention is the provision of a high speed embedded DRAM with a simple interface circuit between a large capacity, high speed DRAM memory and a SRAM cache to achieve a fast-cycle memory performance. The interface circuit provides wider bandwidth internal communications than external data transfers. The interface circuit schedules parallel pipeline operations so that one set of bus wiring can be shared in cycles by several data flows to save chip area and alleviate data congestion. The interface circuit utilizes a single port SRAM, instead of a dual port SRAM, which is used for short-cycle, high-speed data operations. A flexible design is provided that can be used for a range of bandwidths of data transfer. The sizes of the bandwidths indicated in the disclosed embodiment are only exemplary, and generally any size bandwidth ranging from 32 to 4096 wide can use the same approach.

Significant features of this invention can be summarized as:

(1) providing a high-efficiency parallel-pipeline data flow so that, within each cycle, up to five tasks can be executed simultaneously, (2) controlling data flow in each pipeline so that a majority of the internal buses can be time shared to save chip area, (3) minimizing the process time of each cycle so that both latency and cycle time can be reduced, and (4) realizing fast-cycle, high-speed, high-density eDRAM applications without using a large sized dual port SRAM cache.

BRIEF DESCRIPTION OF THE DRAWINGS

The foregoing objects and advantages of the present invention for a high speed embedded DRAM with a SRAM-like interface may be more readily understood by one skilled in the art with reference being had to the following detailed description of several preferred embodiments thereof, taken in conjunction with the accompanying drawings wherein like elements are designated by similar reference numerals throughout the several views, and in which:

FIG. 8-1 illustrates RH and WH operations proceeding simultaneously in parallel, noting that if the memory controller can prefetch more than one command, then the RH and WH operations can be processed at the same time.

FIG. 8-2 illustrates WH and RM operations proceeding simultaneously in parallel.

FIG. 8-3 illustrates a required two pipe delay for parallel RH and WM operations, and vice versa.

FIG. 8-4 shows a required two pipe delay for RM and WM operations, and vice versa.

DETAILED DESCRIPTION OF THE DRAWINGS

Figure 1:
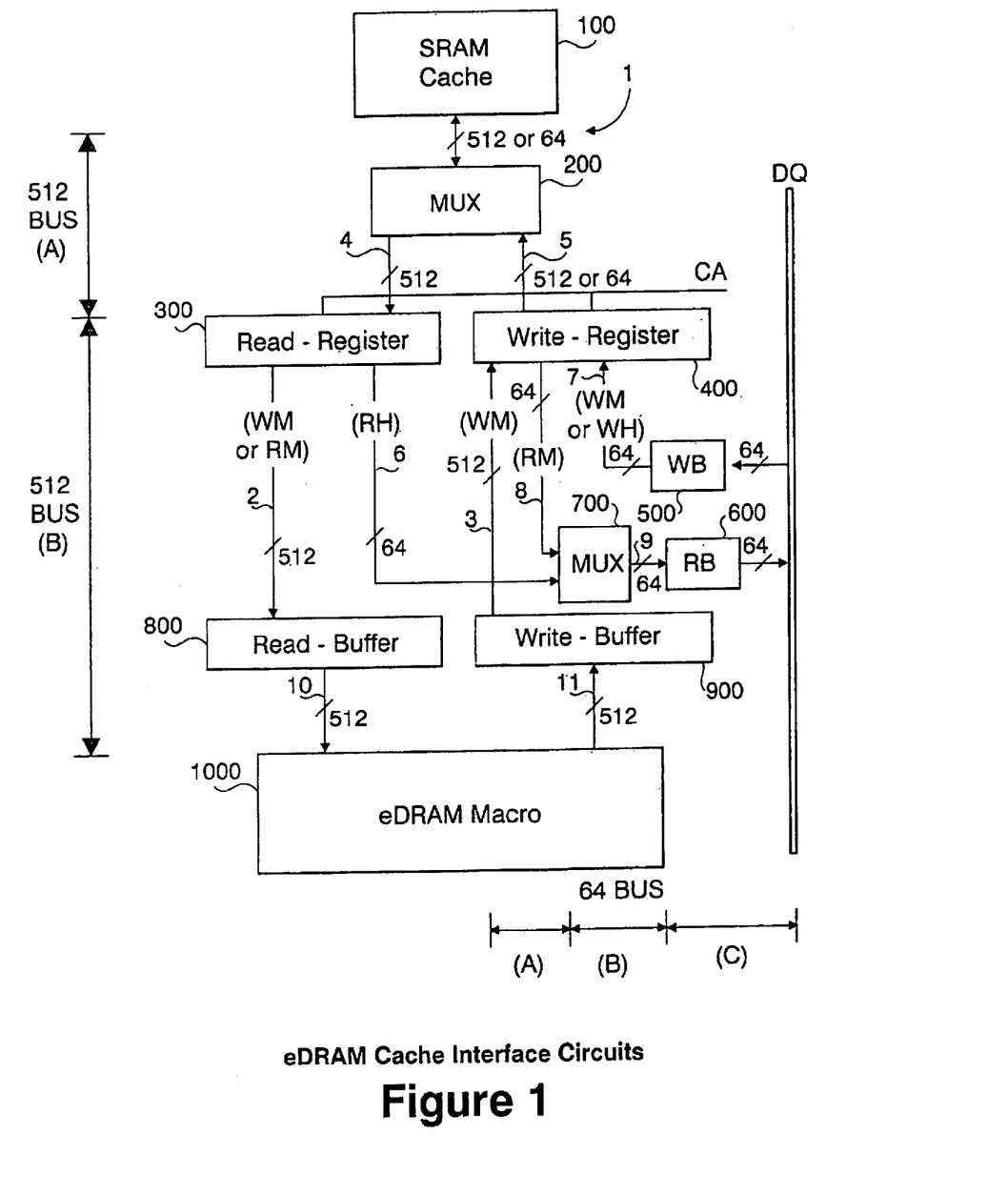
FIG. 1 is a block diagram of a high speed DRAM which includes an interface circuit between a high speed DRAM memory and a SRAM cache which provides wider bandwidth data communications between the large capacity DRAM and the SRAM cache than between the SRAM cache and data communications to the outside world through data buses DQ.

FIG. 1 is a block diagram of a high speed DRAM which includes an interface circuit designed to provide wider bandwidth data communications between a large capacity eDRAM memory 1000 and a SRAM cache 100 than between the SRAM cache 100 and the outside world through data buses DQ.

A small single port SRAM array 100 is used as a high-speed cache between a large-sized eDRAM memory 1000 and CPU(s) (not shown) over the data buses DQ. The size of the cache 100 depends upon the architecture of the eDRAM 1000, and is generally in the range of 64K to 1 M. The circuit of FIG. 1 provides a wide bandwidth interface circuit between the SRAM cache 100 and the eDRAM 1000. A short distance therebetween allows a wide internal data bandwidth over wide data bus sets to improve the circuit performance. However, such wide data bus sets should be shared as much as possible. In the exemplary circuit, 512 bit (wide) bandwidth data bus sets are used between the cache 100 and the eDRAM 1000.

Because of a restriction on the number of I/O pins, the bandwidth to the outside world is limited to 64 bits via the shared data DQ buses.

The interface circuit couples data between the high speed DRAM 1000 and the cache memory 100 which comprises a single port SRAM. A read register 300 is coupled between the cache memory and the DRAM memory, for transferring data from the cache memory to the DRAM memory. A write register 400 is coupled between the DRAM memory and the cache memory, for transferring data from the DRAM memory to the cache memory.

A first bi-directional data bus 1 is coupled between the cache memory 100 and both the read register 300 and the write register 400. A multiplexer 200 couples the cache memory 100 to either of the read register 300 or the write register 400. A fourth data bus 4 couples the multiplexer 200 to the read register 300, and a fifth data bus 5 couples the multiplexer 200 to the write register 400. The data flows through the bi-directional bus 1 in a first direction from the cache memory to the read register, and data flows through the bi-directional bus 1 in a second opposite direction from the write register to the cache memory, such that opposite direction data flows share the same bi-directional data bus 1 in different cycles.

A second data bus 2 is coupled between the read register 300 and the DRAM memory 1000, and a third data bus 3 is coupled between the DRAM memory and the write register, wherein during operation data flows from the read register to the DRAM memory in one cycle, and data flows from the DRAM memory to the write register in another cycle, to share access to the DRAM memory in different cycles.

A sixth data bus 6 couples the read register 300 to a data output from the circuit through a multiplexer 700, a ninth data bus 9, and a read buffer. A seventh data bus 7 couples a data input to the interface circuit through data lines DQ and a write buffer 500 to the write register 400. An eighth data bus 8 couples the write register 400 to a data output from the circuit, through the multiplexer 700, a read buffer 600 and the data lines DQ. A multiplexer 700 switches between inputs received from the sixth data bus 6 from the read register 300 and the eight data bus 8 from the write register 400, and outputs data onto the ninth data bus 9 coupled to a data output from the circuit to the data lines DQ.

A read buffer 800 couples the read register 300 to the DRAM 1000 memory through the read buffer 800 and a tenth data bus 10, and an eleventh data bus 11 couples the DRAM memory 1000 to a write buffer 900 which is coupled through the third data bus 3 to the write register 400.

In the disclosed embodiment, the first, second, third, fourth, fifth, tenth, and eleventh data buses all have the same first wide data bandwidth of 512 bits, and the sixth, seventh, eight, and ninth data buses all have the same second narrow data bandwidth of 64 bits.

A 512 bit wide data bus is connected between the cache 100 and the read register 300 (buses 1, 4 in series) and the write register 400 (buses 1, 5 in series) via the multiplexer 200. In the following explanations, these buses are termed 512 BUS(A). The data bus 1 is bi-directional, providing for data flow both into and out of the cache 100. However, the data flows in the data bus 1 are time shared, and are always in one direction at any one time, depending upon the pipeline control. The buses 2, 3, 10 and 11 are termed 512 BUS(B).

Figure 4:
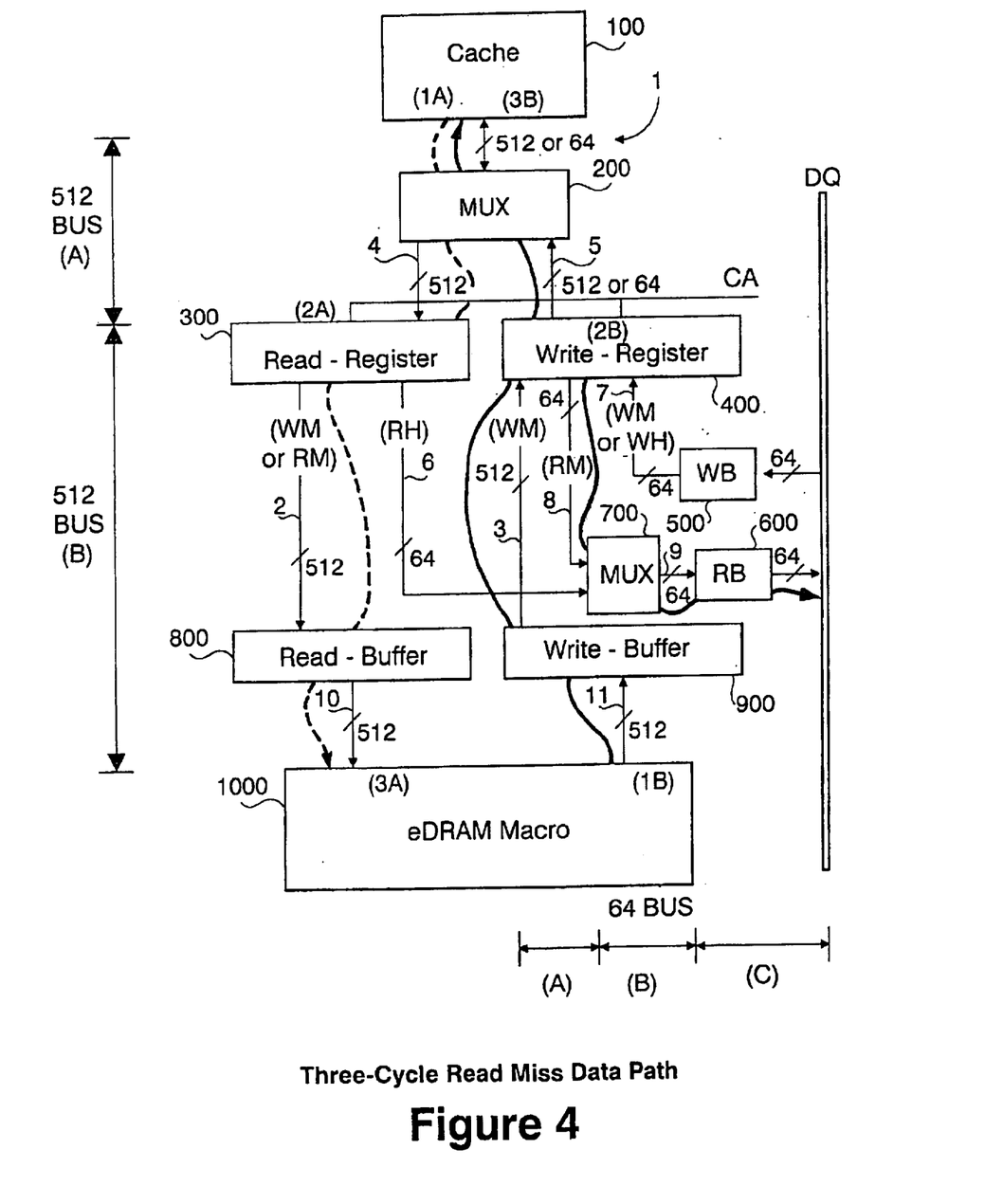
FIG. 4 illustrates the flow of data in the block diagram of FIG. 1 for a three cycle read-miss RM data operation.
Figure 5:
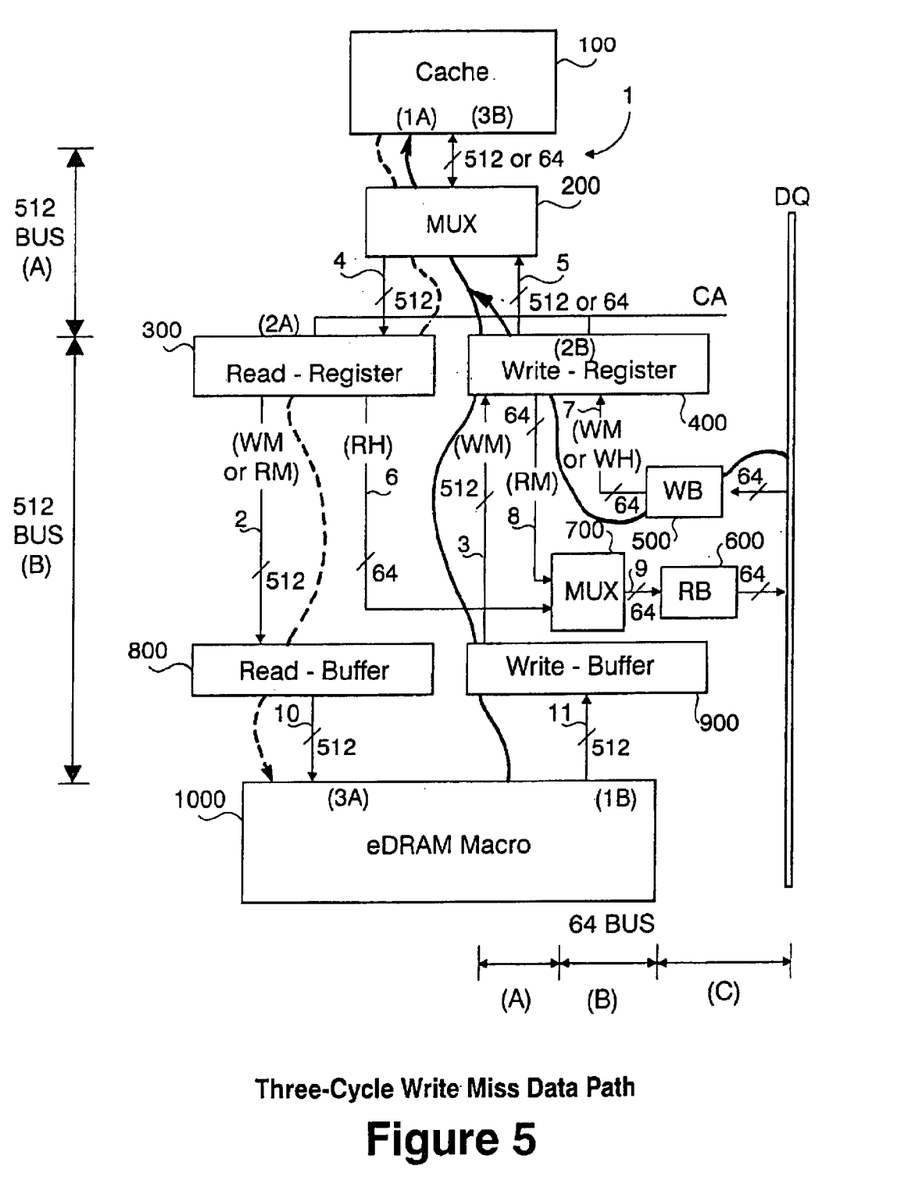
FIG. 5 illustrates the flow of data in the block diagram of FIG. 1 for a three cycle write-miss WM data operation.

For example, when detecting a write miss WM, as illustrated in FIG. 5, or a read miss RM, as illustrated in FIG. 4, old data inside the cache 100 are retired, and thus must be transferred from the cache 100 to the eDRAM 1000 via a read buffer 800.

For a read miss RM, as illustrated in FIG. 4, a new set of data are retrieved from the eDRAM 1000, not only to replace the old data in the cache 100, but also to be sent to the outside world via the output read buffer 600. Therefore, during the first cycle of data flow, data flows from the cache 100 through the 512 BUS(A) and is latched into the Read Register 300, and data coming from the eDRAM 1000 are latched into the Write Register 400 through the 512 BUS (B). In the second cycle, the directional flows of the data are reversed in the BUSes (A) and (B).

Similarly, for a write miss WM, as illustrated in FIG. 5, a new set of data are written into the cache 100 to replace the retired data, partly from the outside world (64 bit) via a write buffer 500, and the rest of the data are from the eDRAM 1000. These data are merged in the Write Register 400. Again, the bi-directional data flows time-share the buses during different cycles.

Figure 2:
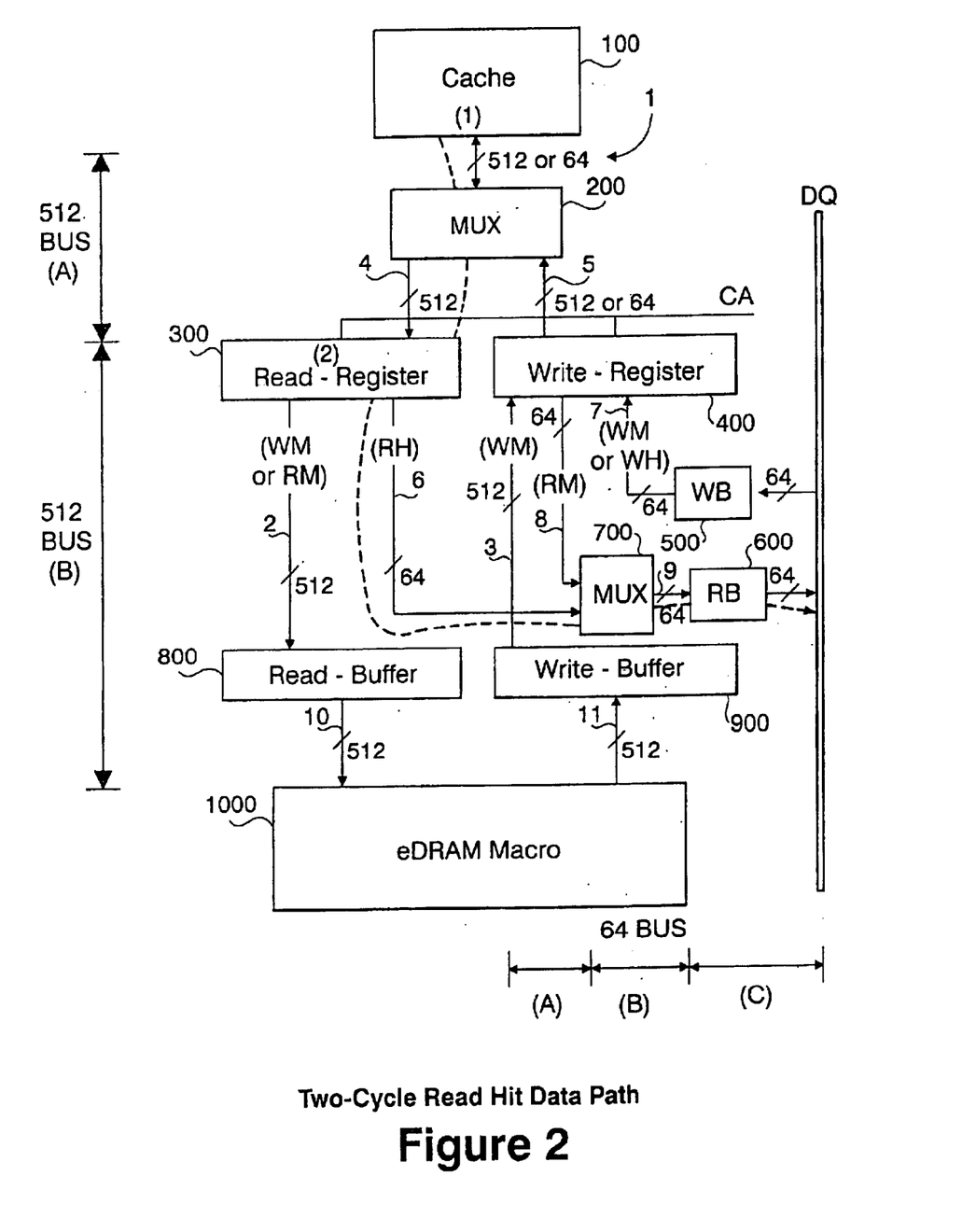
FIG. 2 illustrates the flow of data in the block diagram of FIG. 1 for a two cycle read-hit RH data operation.

When detecting a read hit RH, as illustrated in FIG. 2, data are also transferred (nondestructively) from the cache 100 through the read register 300 to an output read buffer 600 via a MUX 700. Here, according to a column address, only a portion of the data are transferred out.

Figure 3:
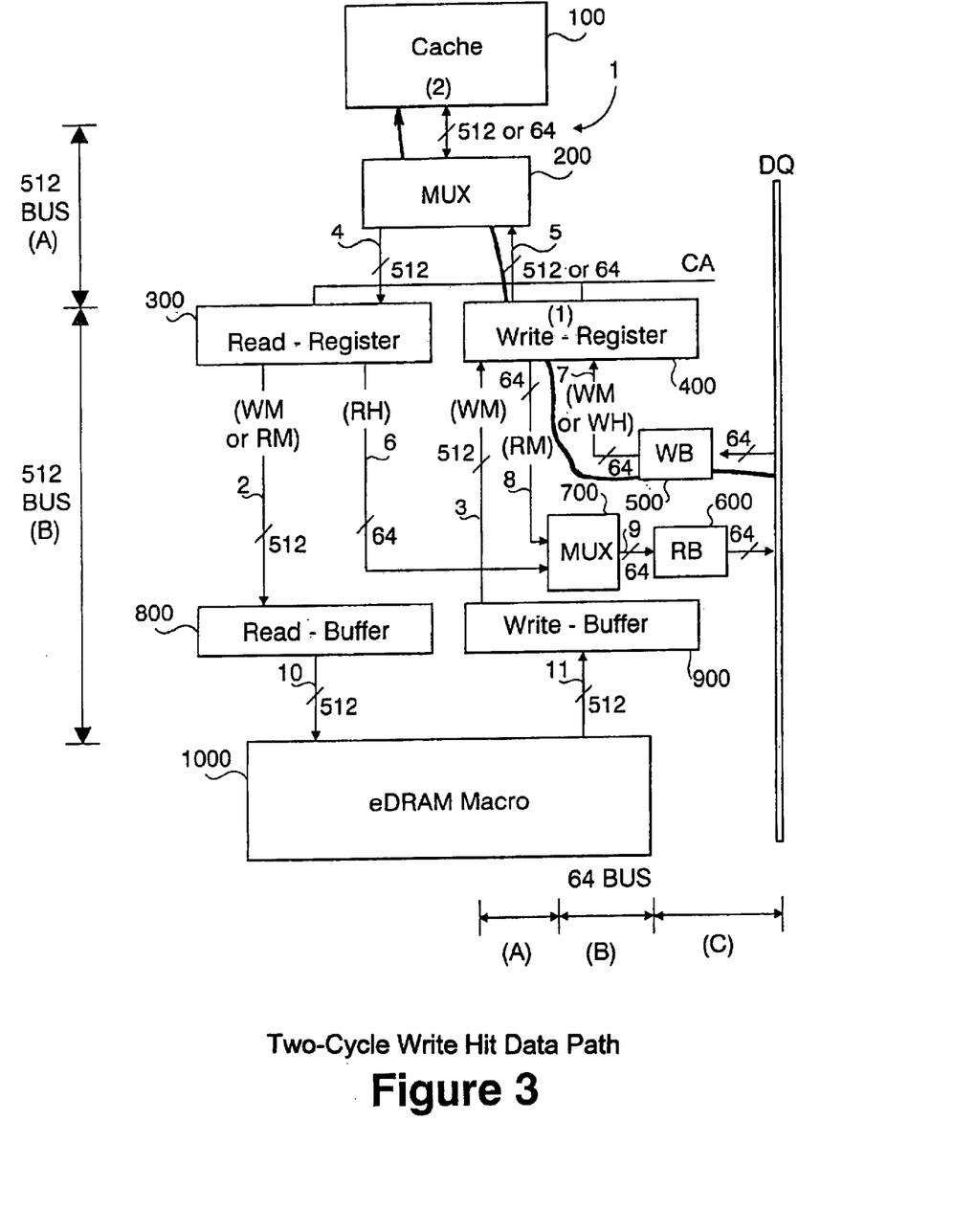
FIG. 3 illustrates the flow of data in the block diagram of FIG. 1 for a two cycle write-hit WH data operation.

Finally, for a write hit WH, as illustrated in FIG. 3, a new set of 64 bit data are transferred to the cache 100 and overwrite the portion of the old data therein.

Details of these operations can be understood more clearly by the following descriptions for cases including: (1) Read Hit RH, (2) Read Miss RM, (3) Write Hit WH and (4) Write Miss WM.

FIG. 2 illustrates the flow of data for a two cycle read-hit RH operation. The 512 bit data that resided in the cache 100 are read out according to the row address. These data are latched into the read register 300 based upon the column address, and only a portion (for example 64 bits) of these data are transferred out to the data DQ buses via the MUX 700 and the output read buffer 600. The whole process takes two clock cycles of the pipeline process. In the first clock cycle, data are latched in sense amplifiers of the SRAM cache 100. In the second clock cycle, data are latched and decoded in the read register 300. Details on the pipe cycles are given below. The number of cycles indicated herein is only illustrative, and alternative embodiments could use a different number of cycles.

FIG. 3 illustrates the flow of data for a two cycle write hit WH operation. In this process, when the system detects the write address is in the cache 100, then it transfers 64 bit data from the data DQ buses to the cache 100. These data flow via the output write buffer 500, and are then latched into the write register 400. Note that the data only occupy a portion of the write register 400 (64 out of 512), and only this portion is written into the cache based upon column address. The rest of the data in the same row of the cache is maintained unchanged.

The write hit WH operation, illustrated in FIG. 3, takes two clock cycles to finish. In a first clock cycle, data are written into the write register 400, and then in a second clock cycle are latched into the sense amplifiers of the SRAM cache 100.

FIG. 4 illustrates the flow of data for a three cycle read miss RM operation. When the system detects that the read data is not resident in the cache 100, then immediately the old data with the same row address are written back into the eDRAM 1000. The reason is that for the fast cycle eDRAM operation, the original data are destroyed after they are read into the cache 100. This operation can be performed as described in a disclosure by Toshiaki Kirihata, et al., titled, "A Destructive Read Architecture for Dynamic Random Access Memories", as disclosed in IBM docket FIS2000-0411. Therefore, when these data are not needed in the cache, they must be written back to the eDRAM, otherwise the data will be lost.

The write-back operation is needed for both read miss RM and write miss WM operations. As illustrated in FIG. 4, while the unwanted old data are written back to the eDRAM, a new set of 512 bit data from the eDRAM with the correct row address is read into the write register 400 and then to cache 100 to replace the old data set. While retrieving these data, a portion of the data are read to the data DQ buses based upon the column address. The decoding is done in the write register 400, and from there a selected 64 bits of data are transferred to the data DQ buses via an output read buffer 600. Thus two streams of data are transferred simultaneously in two opposite paths via two sets of 512 buses (A) and (B). The read and the write registers 300, 400 are needed for the purpose of sharing these buses. For example, in the first clock cycle, the old data are latched into the cache 100 sense amplifiers, while the new data are latched in the DRAM 1000 sense amplifiers. In the second cycle, the old data are latched into the read register 300, while the new data are latched into the write register 400. At the same time, 64 bit of the data are sent to the data DQ buses and are latched into the read buffer 600. Finally, in the third cycle, the old data are written back into the eDRAM 1000, and the new data from eDRAM 1000 are transferred into the cache 100 to replace the old data. As a result, all of the 512 bit wide buses from the cache through the mux 200, register 300 and buffer 800 to the eDRAM 1000 can be time shared to save chip space. However, separate local 64 bit wide data buses may be needed to send data out to the data DQ buses. The horizontal 64 bit wide bus set group can be divided in (A), (B) and (C) bus sections. According to this diagram, only the (A) bus section accommodate one direction of data flow, while both the (B) and (C) bus sections accommodate bi-directional data flow and are time shared among the in and out data sets.

FIG. 5 illustrates the flow of data for a three cycle write miss WM operation. When the system detects the write data address is not resident in the cache 100, then again, the old data in the same row of the cache are written back into the eDRAM 1000. In the first cycle, the old data are latched in the sense amplifiers in the cache 100, while the new data are latched in the eDRAM sense amplifiers 1000. Also, 64 bits of the new data are latched into the write register 400 via (B) and (C) bus portions of 64 bits wide. In the second cycle, the old data are transferred to the read register 300 via the (A) bus portion of 512 bits wide. At the same time, the new data are transferred from eDRAM 1000 to the Write-Register 400 via the (B) bus portion of 512 bits wide. Inside the write register 400, based on the column address, the 512 bits of data from the eDRAM 1000 and the 64 bits data from the data DQ bus sets are merged. Finally, in the third cycle, the old data are transferred and latched into the eDRAM 1000 array, while the new data are sent to the SRAM cache 100.

Parallel Pipeline Operation:

The uniqueness of this arrangement is that multiple operations can proceed in a parallel manner.

Figure 6:
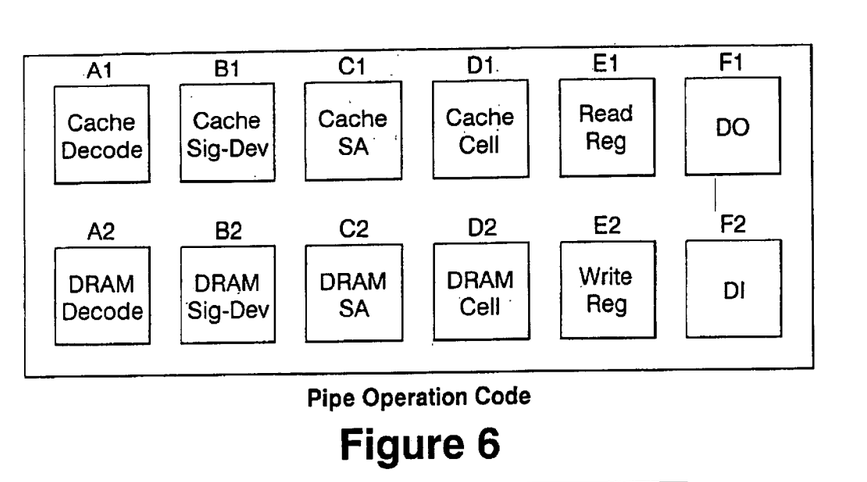
FIG. 6 identifies pipe steps and pipe operation codes for different data operations.

FIG. 6 identifies all of the pipe steps and pipe operation codes including:

Cache decode via row address (A1),

Cache signal development time is the time required to get data from a SRAM cell (B1), Cache sense time is the time required to amplify the data and send the data out of the cache (C1), Cache cell time is the time to write and latch data to a SRAM cell (D1), Read Register time is the time to transfer data to the read register and park the data there (E1), DO is the time to get data from the data DQ buses from the output read buffer (F1), DRAM decoding time is the time when receiving a row address (A2), DRAM signal development time is the time that the bit-line receives signal from a cell (B2), DRAM sensing time (C2), DRAM cell time is the time to write data back to DRAM cell (D2), Write register time is the time to send data to the write register and park the data there (E2), the time to send data to the data DQ buses via the output write buffer (F2).

Therefore, a Read Hit RH operation involves A1, B1, C1, E1 and F2, a total of five pipes. A Write Hit WH involves F1, E2, A1 and D1, a total of four pipes. Here, assume that write drivers drive the data directly to the bitlines and bypass the sense amplifiers.

For a Read Miss RM operation, three pipes proceed in parallel. The first 6-step pipe writes the old data from the cache to the DRAM, the second 6-step pipe writes the data from the DRAM to the cache, and the last single step pipe retrieves the data out. The details are described above and will not be repeated here.

Figure 7:
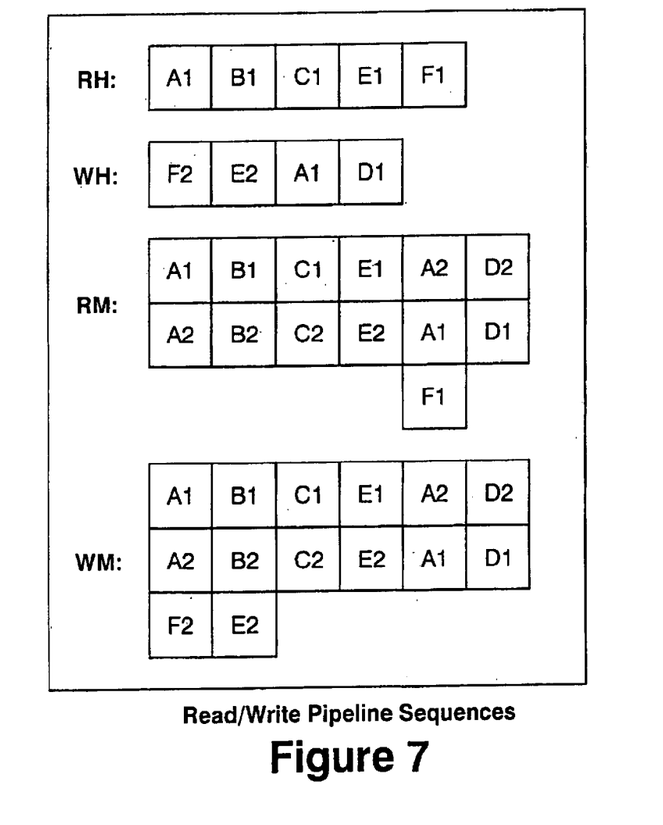
FIG. 7 shows Read/Write pipeline sequences for operations of RH, WH, RM and WM.

Similarly, FIG. 7 shows a Write Miss WM operation.

Figure 81:
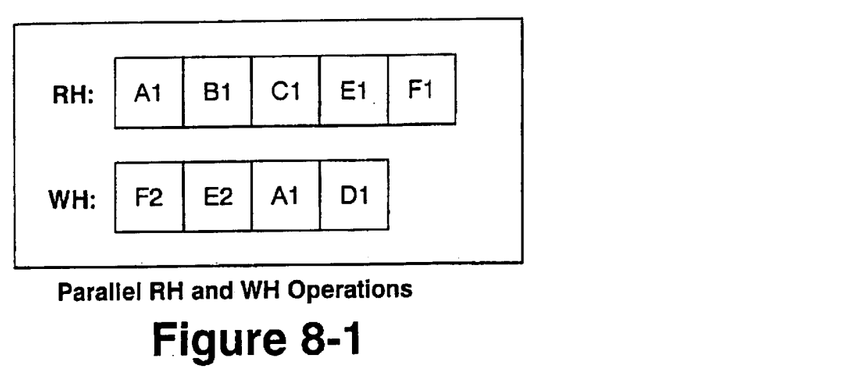

FIG. 8-1 illustrates RH and WH operations proceeding simultaneously in parallel. If the memory controller can prefetch more than one command, then the RH and WH operations can be processed at the same time. Otherwise, a pipe delay is required.

Figure 82:
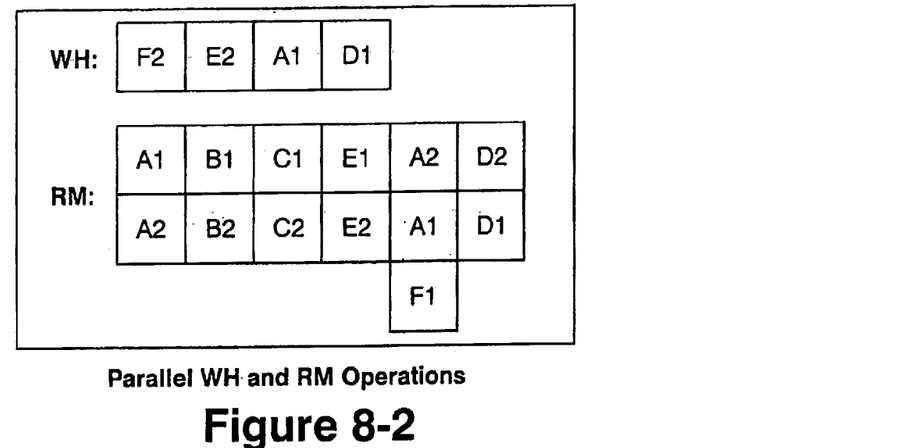

FIG. 8-2 illustrates WH and RM operations proceeding simultaneously in parallel.

Figure 83:
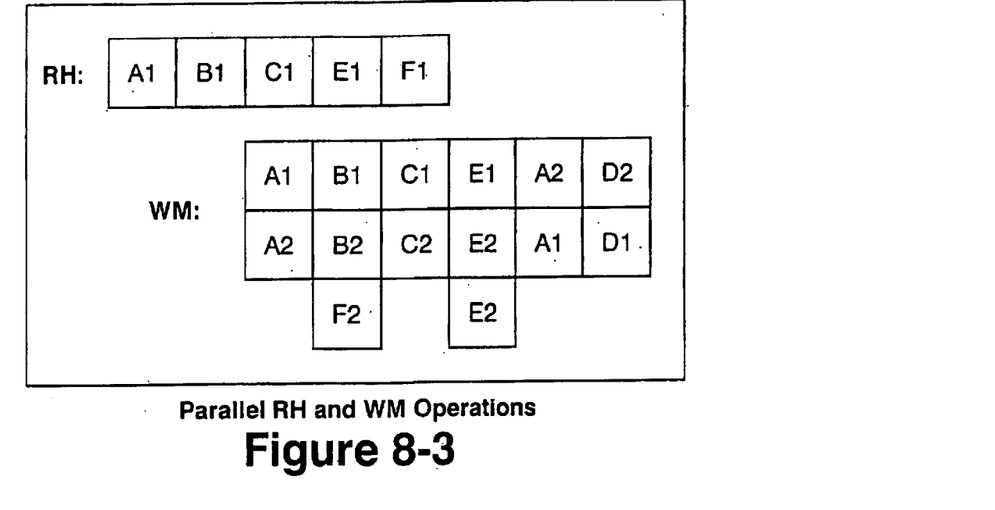

FIG. 8-3 illustrates that two pipe delays are required for the RH and WM operations, and vice versa.

Figure 84:
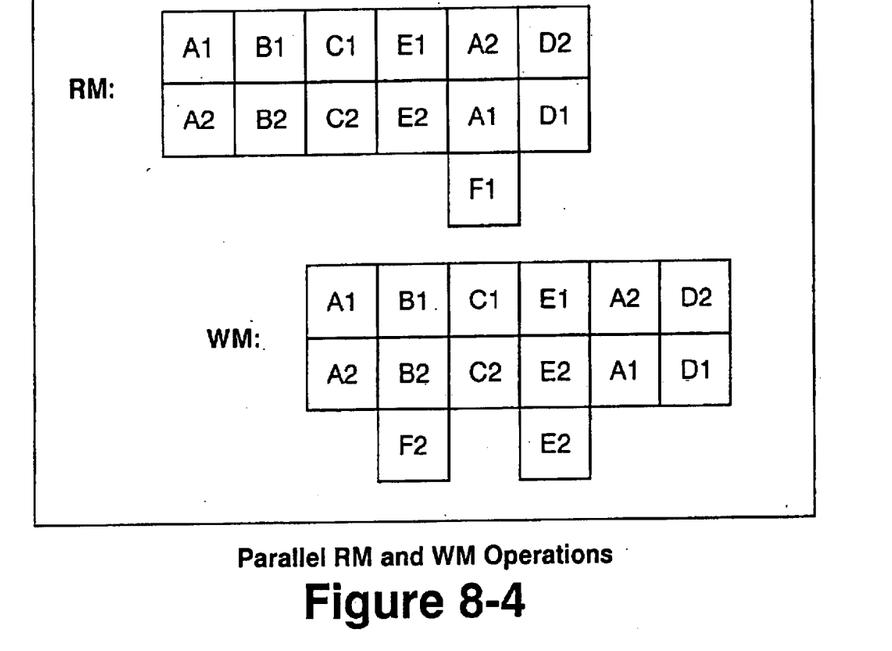

FIG. 8-4 also shows that two pipe delays are required for RM and WM operations, and vice versa.

These are the four combinations that could happen for any two consecutive operations. Based on this, the pipe delay can be easily estimated for the other 12 possible combinations.

Figure 9:
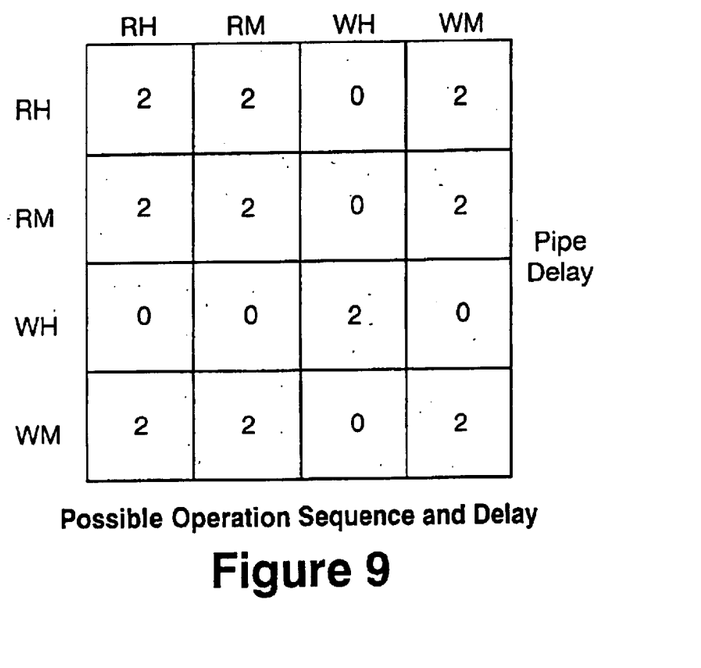
FIG. 9 is a summary of possible operation sequences and pipe delays for 16 different combinations of possible operations.

FIG. 9 is a summary of the pipe delays for 16 possible combinations of operations.

One purpose of defining such a fine pipe stage is to provide high-efficiency parallel processing. As shown in FIG. 8-4, for example, the maximum number of operations of the parallel process is five. The worst case latency and consequent delay will be five and two, respectively. Since each stage is short, with today's technology, 2 ns per stage is a reasonable estimation. Therefore, this design can achieve 10 ns latency and 2 ns (0 pipe) to 4 ns (2 pipe) data cycle time.

Further improvements are also possible based upon the same concepts, including a multiple instruction process, a dual clock rate, I/O data interleaving, etc.

Significant features of this invention can be summarized as:

(1) providing a high-efficiency parallel-pipeline data flow so that, within each cycle, up to five tasks can be executed simultaneously, (2) controlling data flow in each pipeline so that a majority of the internal buses can be time shared to save chip area, (3) minimizing the process time of each cycle so that both latency and cycle time can be reduced, and (4) realizing fast-cycle, high-speed, high-density eDRAM applications without using a large sized dual port SRAM cache.

While several embodiments and variations of the present invention for a high speed embedded DRAM with a SRAM-like interface are described in detail herein, it should be apparent that the disclosure and teachings of the present invention will suggest many alternative designs to those skilled in the art.

Having thus described our invention, what we claim as new, and desire to secure by Letters Patent is:

1. A high speed DRAM, comprising:
   a DRAM memory;
   a cache memory comprising a single port SRAM;
   a read register coupled between the cache memory and the DRAM memory, for transferring data from the cache memory to the DRAM memory;
   a write register coupled between the DRAM memory and the cache memory, for transferring data from the DRAM memory to the cache memory;
   a first bi-directional data bus set coupled between the memory and both the read register and the write register to perform pipeline memory operations, wherein data flows through the bi-directional bus in a first direction from the cache memory to the read register, and data flows through the bi-directional bus in a second opposite direction from the write register to the cache memory, such that opposite direction data flows share the same bi-directional data bus in different cycles;
   a second data bus set coupled between the read register and the DRAM memory;
   a third data bus set coupled between the DRAM memory and the write register.

2. The high speed DRAM of claim 1, wherein a multiplexer couples the cache memory to either of the read register or the write register, and a fourth data bus couples the multiplexer to the read register, and a fifth data bus couples the multiplexer to the write register.

3. The high speed DRAM of claim 1, wherein a sixth data bus couples the read register to a data output from the high speed DRAM, and a seventh data bus couples a data input to the high speed DRAM to the write register.

4. The high speed DRAM of claim 3, wherein an eighth data bus couples the write register to outside data buses.

5. The high speed DRAM of claim 4, wherein a multiplexer switches between inputs received from the sixth data bus from the read register and the eight data bus from the write register, and outputs data onto a ninth data bus coupled to the outside data buses.

6. The high speed DRAM of claim 5, wherein a read buffer couples the read register to the DRAM memory through a tenth data bus.

7. The high speed DRAM of claim 6, wherein an eleventh data bus couples the DRAM memory to a write buffer which is coupled through the third data bus to the write register.

8. The high speed DRAM of claim 6, wherein the first, second, third, fourth, fifth, tenth, and eleventh data buses all have the same first wide data bandwidth.

9. The high speed DRAM of claim 5, wherein the sixth, seventh, eight, and ninth data buses all have the same second narrow data bandwidth.

10. The high speed DRAM of claim 1, wherein data flows from the read register to the DRAM memory in a first cycle, and data flows from the DRAM memory to the write register in a second cycle, to share access to the DRAM memory in different cycles.

11. A method of operating the high speed DRAM of claim 2, wherein for a read miss operation, a new set of data are retrieved from the DRAM memory to replace old data in the cache memory, and also to be sent to outside data buses through an output read buffer, and during a first cycle of data flow, data flows from the cache memory through the first and fourth buses and is latched into the read register, and data coming from the DRAM memory are latched into the write register through the third bus, and in a second cycle, the directional flows of the data are reversed through the first and fourth buses and also through the third bus.

12. A method of operating the high speed DRAM of claim 1, wherein for a write miss operation, a new set of data are written into the cache memory to replace retired data, partly from outside data buses via a write buffer, and the rest of the data are from the DRAM memory, and these data are merged in the write register.

13. A method of operating the high speed DRAM of claim 1, wherein for a read hit operation, data are transferred nondestructively from the cache memory through the read register to an output read buffer via a multiplexer, and according to a column address, only a portion of the data are transferred to outside data buses.

14. A method of operating the high speed DRAM of claim 1, wherein for a write hit operation, a new set of data is transferred to the cache and overwrite a portion of the old data therein.

15. A method of operating the high speed DRAM of claim 1, wherein for a two cycle read hit operation, data that resided in the cache memory are read out according to row address and are latched into the read register based upon column address, and only a portion of these data are transferred to outside data buses via the multiplexer and an output read buffer, and in a first clock cycle, data are latched in sense amplifiers of the cache memory, and in a second clock cycle, data are latched and decoded in the read register.

16. A method of operating the high speed DRAM of claim 1, wherein for a two cycle write hit operation, upon detecting a write address is in the cache memory, data is transferred from outside data buses to the cache memory, these data flow via an output write buffer and are then latched into the write register and only occupy a portion of the write register, and only this portion is written into the cache memory based upon column address, and the rest of the data in the same row of the cache memory is maintained unchanged, in a first clock cycle, data are written into the write register, and in a second clock cycle these data are latched into sense amplifiers of the cache memory.

17. A method of operating the high speed DRAM of claim 1, wherein for a three cycle read miss operation, upon detecting that read data are not resident in the cache memory, then old data with the same row address are written back into the DRAM memory in a fast cycle DRAM operation wherein original data are destroyed after they are read into the cache memory, and therefore when these data are not needed in the cache memory, they are written back to the DRAM memory to prevent a data loss.

18. A method of operating the high speed DRAM of claim 1, wherein for a three cycle write miss operation, upon detecting that write data address is not resident in the cache memory, then old data in the same row of the cache memory are written back into the DRAM memory, and in a first cycle, old data are latched in sense amplifiers in the cache memory while new data are latched in DRAM memory sense amplifiers and a set of the new data are latched into the write register, and in a second cycle, old data are transferred to the read register, and at the same time new data are transferred from the DRAM memory to the write register, wherein based on the column address, data from the DRAM memory and a set of data from outside data buses are merged, in a third cycle, old data are transferred and latched into the DRAM memory while new data are sent to the cache memory.

19. A method of operating the high speed DRAM of claim 1, wherein for a write back operation, which is needed for both a read miss operation and a write miss operation while old data are written back to the DRAM memory, a new set of data from the DRAM memory with a correct row address is read into the write register and then to the cache memory to replace the old data, while retrieving these data, a portion of the data are read to outside data buses based upon column address, decoding is performed in the write register, a selected set of data are transferred to the outside data buses via an output read buffer, wherein two streams of data are transferred simultaneously in two opposite paths via two sets of bus sets, in a first clock cycle, old data are latched into the cache memory sense amplifiers, while new data are latched in the DRAM memory sense amplifiers, in a second cycle, old data are latched into the read register while new data are latched into the write register, and at the same time a set of the data are sent to the outside data buses and are latched into a read buffer, in a third cycle, old data are written back into the DRAM memory, and new data from the DRAM memory are transferred into the cache memory to replace old data.

* * * * *